(12) United States Patent
Rascuna' et al.

(10) Patent No.: US 11,417,778 B2
(45) Date of Patent: Aug. 16, 2022

(54) SEMICONDUCTOR MPS DIODE WITH REDUCED CURRENT-CROWDING EFFECT AND MANUFACTURING METHOD THEREOF

(71) Applicant: STMICROELECTRONICS S.R.L., Agrate Brianza (IT)

(72) Inventors: Simone Rascuna', Catania (IT); Mario Giuseppe Saggio, Aci Bonaccorsi (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 26 days.

(21) Appl. No.: 16/825,214

(22) Filed: Mar. 20, 2020

(65) Prior Publication Data

US 2020/0303564 A1 Sep. 24, 2020

(30) Foreign Application Priority Data

Mar. 22, 2019 (IT) .......................... 102019000004195

(51) Int. Cl.
| | |
|---|---|
| *H01L 29/45* | (2006.01) |
| *H01L 29/872* | (2006.01) |
| *H01L 29/06* | (2006.01) |
| *H01L 29/16* | (2006.01) |
| *H01L 29/20* | (2006.01) |
| *H01L 29/47* | (2006.01) |
| *H01L 29/66* | (2006.01) |

(52) U.S. Cl.
CPC ........ *H01L 29/872* (2013.01); *H01L 29/0619* (2013.01); *H01L 29/1608* (2013.01); *H01L 29/2003* (2013.01); *H01L 29/45* (2013.01); *H01L 29/47* (2013.01); *H01L 29/66143* (2013.01); *H01L 29/66212* (2013.01)

(58) Field of Classification Search
CPC combination set(s) only.
See application file for complete search history.

(56) References Cited

U.S. PATENT DOCUMENTS

| | | |
|---|---|---|
| 9,455,326 B2 | 9/2016 | Kinoshita et al. |
| 2003/0020133 A1 | 1/2003 | Dahlqvist et al. |
| 2008/0277668 A1 | 11/2008 | Okuno et al. |
| 2009/0160008 A1* | 6/2009 | Fujiwara ............... H01L 29/872 257/471 |
| 2013/0105819 A1 | 5/2013 | Kameshiro et al. |

(Continued)

FOREIGN PATENT DOCUMENTS

JP 2011-142355 A 7/2011

*Primary Examiner* — Moin M Rahman
(74) *Attorney, Agent, or Firm* — Seed IP Law Group LLP

(57) ABSTRACT

A merged-PN-Schottky, MPS, diode includes an N substrate, an N-drift layer, a P-doped region in the drift layer, an ohmic contact on the P-doped region, a plurality of cells within the P-doped region and being portions of the drift layer where the P-doped region is absent, an anode metallization on the ohmic contact and on said cells, to form junction-barrier contacts and Schottky contacts respectively. The P-doped region has a grid-shaped layout separating from one another each cell and defining, together with the cells, an active area of the MPS diode. Each cell has a same geometry among quadrangular, quadrangular with rounded corners and circular; and the ohmic contact extends at the doped region with continuity along the grid-shaped layout.

18 Claims, 8 Drawing Sheets

(56) References Cited

U.S. PATENT DOCUMENTS

| | | | |
|---|---|---|---|
| 2014/0266403 A1* | 9/2014 | Das | H01L 29/872 327/493 |
| 2017/0278923 A1 | 9/2017 | Nagaoka et al. | |
| 2018/0190651 A1 | 7/2018 | Siemieniec et al. | |

* cited by examiner

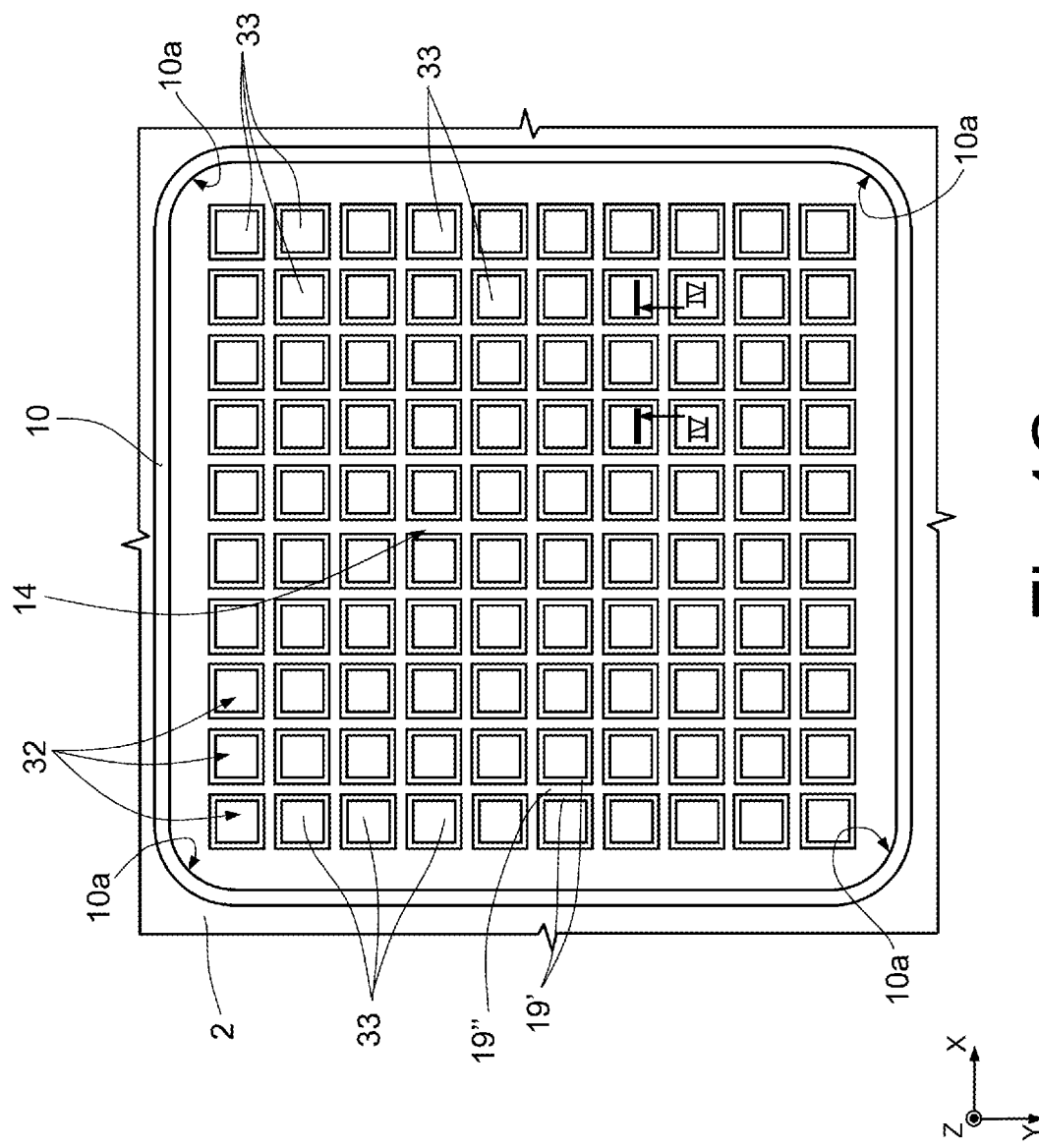

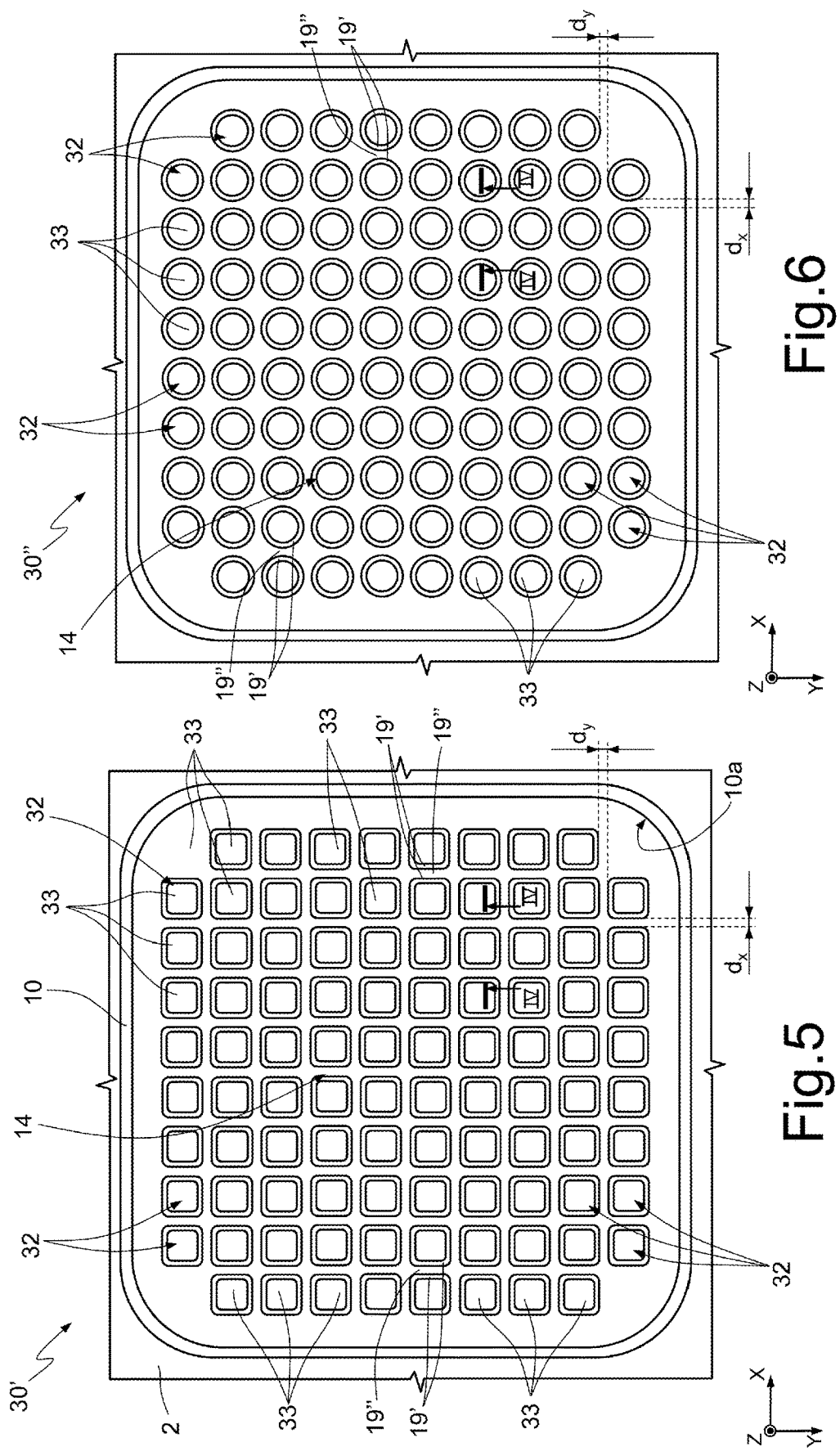

SEMICONDUCTOR MPS DIODE WITH REDUCED CURRENT-CROWDING EFFECT AND MANUFACTURING METHOD THEREOF

BACKGROUND

Technical Field

The present disclosure relates to a semiconductor merged-PN-Schottky (MPS) diode with reduced current-crowding effect and a manufacturing method thereof.

Description of the Related Art

As is known, semiconductor materials which have a wide forbidden band gap, in particular, which have an energy value Eg of the forbidden band gap greater than 1.1 eV, low on-state resistance ($R_{ON}$), high value of thermal conductivity, high operating frequency, and high velocity saturation of charge carriers, are ideal for producing electronic components, such as diodes or transistors, in particular for power applications. A material having said characteristics, and designed to be used manufacturing electronic components, is silicon carbide (SiC). In particular, silicon carbide, in its different polytypes (e.g., 3C—SiC, 4H—SiC, 6H—SiC), is preferable to silicon as regards the properties listed previously.

Electronic devices provided on a silicon carbide substrate, as compared to similar devices provided on a silicon substrate, present numerous advantages, such as low output resistance in conduction, low leakage current, high working temperature, and high working frequencies. In particular, SiC Schottky diodes demonstrated superior switching performance, which renders SiC power devices especially favorable for high-frequency applications. Today's applications pose requirements on the electrical properties as well as on the long-term reliability of the devices.

FIG. 1A shows, in top-plan view in a Cartesian (triaxial) reference system of axis X, Y, Z, a merged-PN-Schottky (MPS) device 1 of a known type. FIG. 1B shows, in the same reference system, a lateral sectional view taken along line I-I, a portion of the MPS device 1.

With joint reference to FIGS. 1A and 1B, the MPS device 1 includes: a substrate 3, of N-type SiC, having a first dopant concentration; a drift layer (epitaxially grown) 2, of N-type SiC, having a second dopant concentration lower than the first dopant concentration, extending on surface 3a of the substrate 3; a cathode terminal 6, of metal material, extending on surface 3b (opposite to surface 3a) of the substrate 3; an anode terminal 8, of metal material (anode metallization), extending on a top surface 2a the drift layer 2; a plurality of junction-barrier (JB) elements 9 in the drift layer 2, facing the top surface 2a of the drift layer 2, and including each a respective implanted region 9' of P-type and a ohmic contact 9" of metal material; and an edge termination region (guard ring) 10, in particular an implanted region of P-type, completely surrounding the junction-barrier (JB) elements 9.

Schottky diodes 12 are formed at the interface between the drift layer 2 and the metallization of the anode metallization 8. In particular, Schottky junctions (metal-semiconductor) are provided by portions of the drift layer 2 in direct electrical contact with respective portions of the anode metallization 8.

The region of the MPS device 1 including the JB elements 9 and the Schottky diodes 12 (i.e., the region contained within the guard ring 10) is an active area 14 of the MPS device 1.

During use in the forward conducting state, due to the lower Schottky onset (about 0.7 V) than the PN onset (about 2.5 V), MPS device 1 functions as a Schottky diode at lower current densities (low on-state losses) and assumes the characteristic of a PN-diode at higher enough current densities. The asymmetric layout of FIG. 1A induces a current-crowding effect in the active area 14 at the corners/rounded regions close to the intersection between the implanted regions 9' and the guard ring 10. Specifically, the corners in the active area 14 concentrate the current at a higher density than the rest of the active area 14. At very high currents, the bipolar conduction tends to be enabled first in these zones because of the higher voltage drop due to the higher current density and because of the higher temperature due to self-heating effect. Thermal runaway on very limited regions, even at relatively small currents, causes the formation of hot spots having a temperature that reaches high values, up to the material melting point, thus inducing a failure of the device or thermo-mechanical stresses that may ultimately lead to cracks in the die.

To overcome the problems mentioned above, known solutions envisage the formation of the JB elements 9 and/or of the Schottky diodes 12 in a cell-like layout instead of a strip-like layout as in FIG. 1A. Such known solutions are shown in FIGS. 2 and 3, where the same reference numbers are used to indicate elements in common with the embodiment of FIGS. 1A, 1B.

FIG. 2 shows, in a top-plan view in the X, Y, Z reference system, an embodiment where the JB elements 9 are in the form of cells or dots, and include each an implanted region 9' having an hexagonal shape, with a respective ohmic contacts 9" formed within the implanted region 9'. The JB elements 9 are organized in a symmetrical array. The ohmic contacts are discontinuous. The Schottky diode 12 is formed by the drift layer 2 surrounding the JB elements 9 and the anode metallization 8 extending above the drift layer 2.

FIG. 3 shows, in a top-plan view in the X, Y, Z reference system, an embodiment where both the Schottky diodes 12 and the JB elements 9 are in the form of cells or dots having a hexagonal shape. More in particular, each JB element 9 is completely surrounded by a respective Schottky diode 12; moreover, each Schottky diode 12 is completely surrounded (in top-plan view), and separated from ad adjacent Schottky diode 12, by a P+ region.

Even though the cell-like layouts of the solutions of FIGS. 2 and 3 allow to avoid current crowding at device corners, the present Applicant found that a small local imbalance of current or temperature of one of the JB elements 9 or Schottky diodes 12 may lead to a local electro-thermal runaway which may cause a failure of the MPS device. Moreover, the presence of several bipolar cells, even if provided with dedicated ohmic contacts 9", does not ensure a fast spreading of bipolar conduction current over the whole PN junction surface.

BRIEF SUMMARY

One or more embodiments of the present disclosure provide a MPS diode with reduced current-crowding effect and a manufacturing method thereof, to overcome the drawbacks of the prior art.

According to the present disclosure, a MPS diode and a manufacturing method thereof are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 4C shows, in top-plan view, a MPS (Merged-PN-Schottky) device according to an embodiment alternative to that of FIG. 4A;

FIGS. 5 and 6 show, in top-plan view, respective layouts alternative to that of FIG. 4A;

DETAILED DESCRIPTION

Figure 4A:
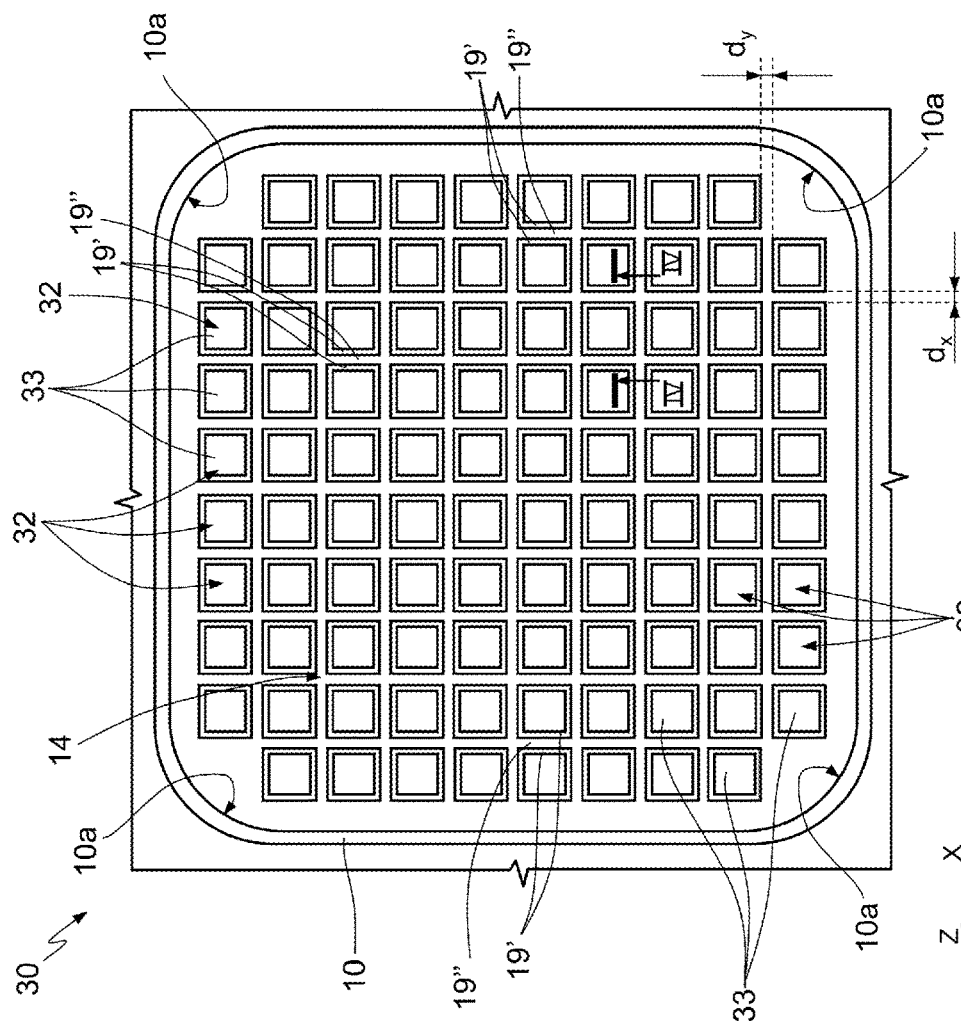
FIGS. 4A and 4B show, in top-plan view and cross-sectional view respectively, a MPS (Merged-PN-Schottky) device according to an embodiment of the present invention.
Figure 4B:
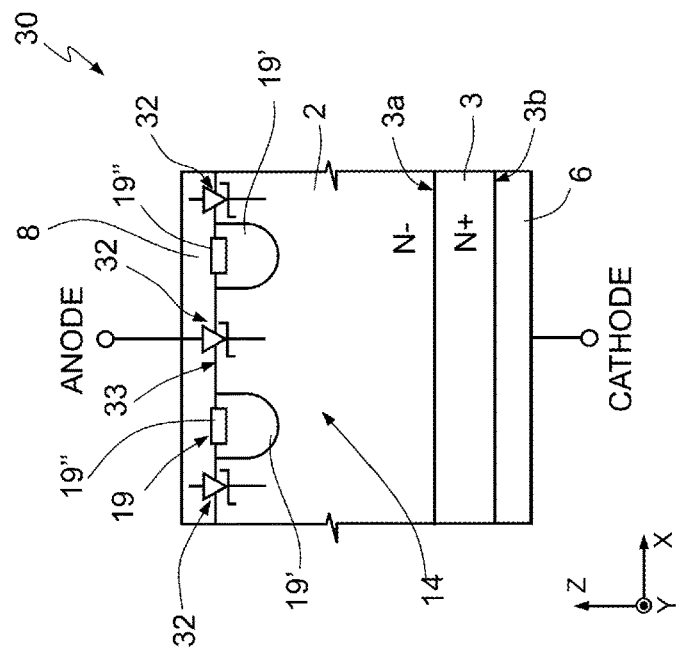

FIG. 4A shows, in the same reference system of axis X, Y, Z of FIGS. 1A-3, a top-plan view (i.e., on XY plane) of a Merged-PN-Schottky (MPS) device 30 (in particular, a MPS diode), according to an embodiment of the present invention. FIG. 4B shows, in the same reference system, a lateral sectional view taken along line IV-IV of FIG. 4A. To improve the understanding of FIG. 4A, the anode metallization 8 is not shown, even if present, as apparent from the view of FIG. 4B.

Figure 1B:
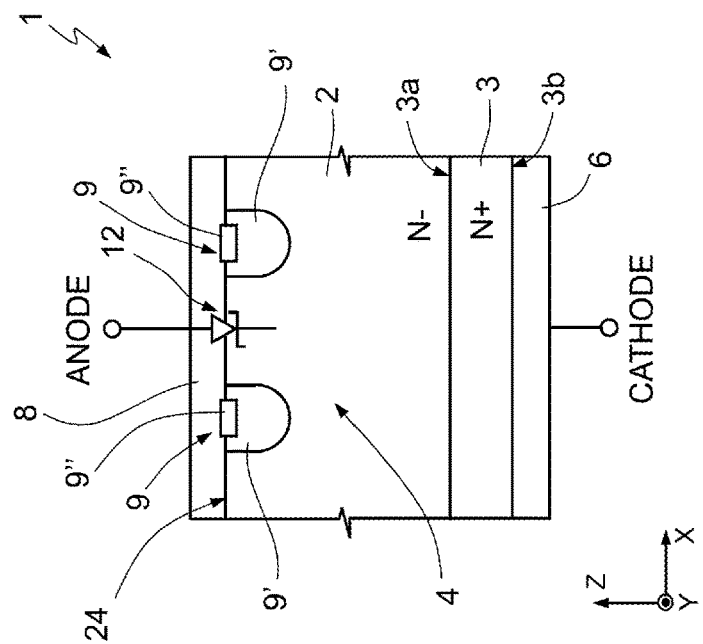
FIGS. 1A and 1B show, in top-plan view and cross-sectional view respectively, a MPS (Merged-PN-Schottky) device according to a known embodiment.
Figure 1A:
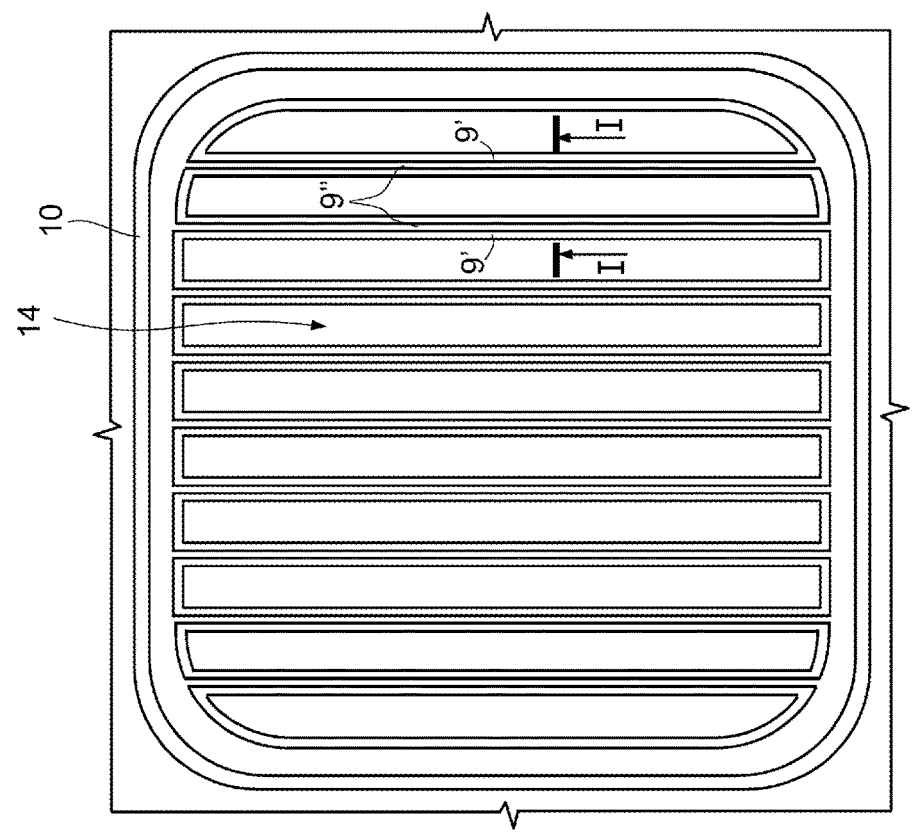
Figure 3:
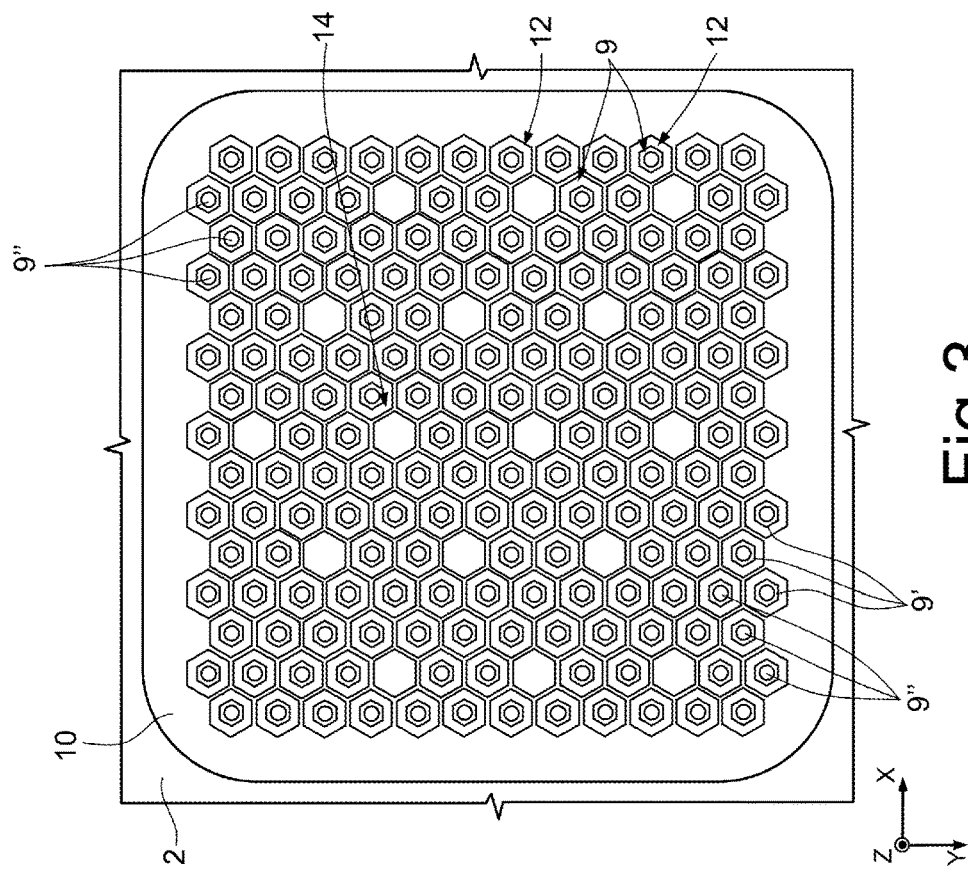
FIG. 3 shows a MPS device according to another known embodiment.
Figure 2:
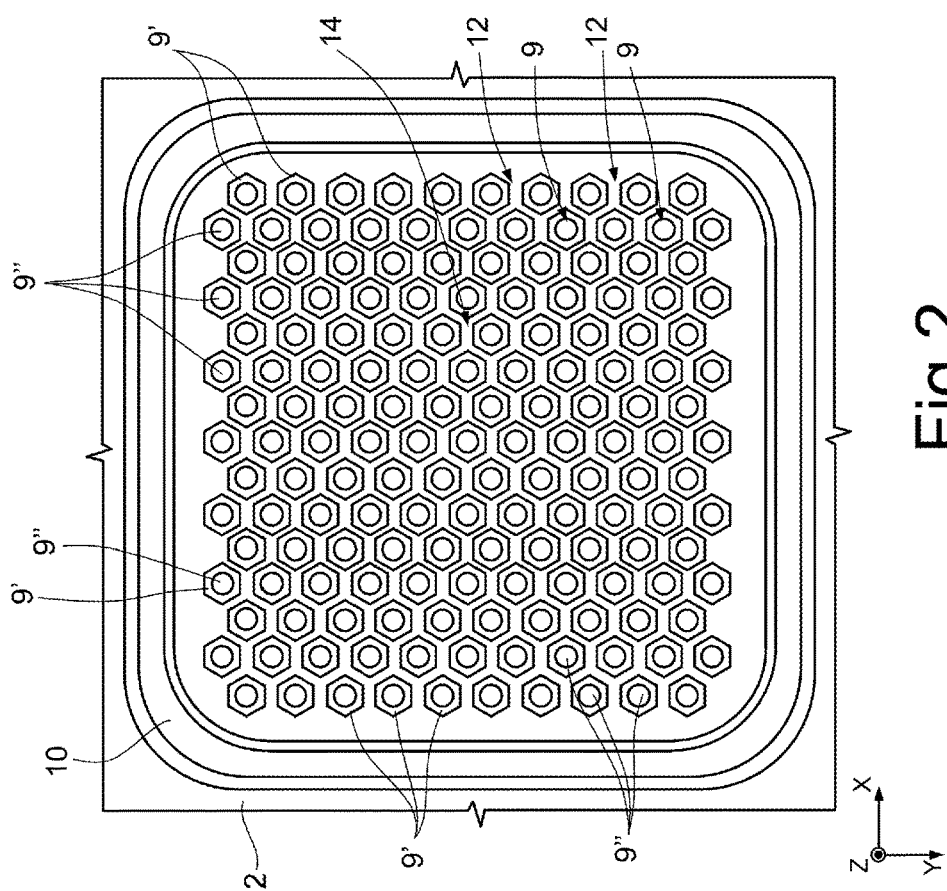
FIG. 2 shows a MPS device according to a further known embodiment.

The lateral sectional view (i.e., on XZ plane) of FIG. 4B conforms substantially to that of FIG. 1B. Analogous elements are identified with the same reference numerals and not further described in detail.

However, when considering the top-plan view of FIG. 4A, the skilled person can appreciate that each Schottky diode 32 of a plurality of Schottky diodes 32 includes a respective Schottky cell (or dot) 33 having, in top-plan view on XY plane, a squared shape; the Schottky cells 33 are arranged in a grid-like pattern, in particular forming a symmetric array of Schottky cells 33. Still more in particular, each Schottky cell 33 includes a superficial region of the drift layer 2 of N type of conductivity and N-doping concentration. The Schottky cells 33 are separated from one another, along X and Y directions, by implanted regions 19', of P conductivity type, extending in the drift layer 2. The implanted regions 19' form a set of squares, each square being one Schottky cell 33. Each Schottky cell 33 is thus completely surrounded, in top-plan view, by a respective one of the implanted regions 19'.

Ohmic contacts 19" (e.g., of nickel silicide—$Ni_2Si$) are formed at each implanted region 19', thereby forming respective JB elements 19. In the top-plan view of FIG. 4A, on the XY plane, the ohmic contacts 19" include stripes along the X-axis direction that cross stripes along the Y-axis direction, to make a continuous grid. Each implanted region 19' laterally surrounding one Schottky cell 33 is electrically connected to the other implanted regions 19' underneath the ohmic contacts 19" as shown in FIG. 4B. As a result, the implanted regions 19' form a continuous grid extending under the grid of ohmic contacts 19".

In an embodiment of the present disclosure, each Schottky cell 33 is separated from an adjacent Schottky cell 33, along the X-axis direction, by a distance $d_X$ in the range 0.5 μm-5 μm; each Schottky cell 33 is separated from an adjacent Schottky cell 33, along the Y-axis direction, by a distance $d_Y$ in the range 0.5 μm-5 μm. In particular, distances $d_X$ and $d_Y$ are equal to one another.

The portion of the MPS device 30 where the Schottky cells 33 are formed is the active area 14 of the MPS device 30.

A guard ring, or edge-termination region, 10, completely surrounding the active area 14, is also optionally present. In the embodiment shown, the guard ring 10 extends as continuation of the implanted regions 19'. In other words, the implanted regions 19' and the guard ring 10 are connected to one another without any discontinuity. It is apparent that a continuous guard ring 10, completely surrounding the active area 14, may be omitted; in this case, the implanted regions 19' ends at the outer edges of the active area 14.

The Schottky cells 33 form, with the anode metallization 8 extending above them and in direct electrical contact with them, the Schottky diodes 32 graphically represented in FIG. 4B.

According to an embodiment of the disclosure, the layout in top-plan view of the MPS device 30 is symmetric with respect to any line of symmetry passing through the centroid of the geometric shape delimited by the guard ring 10. In the absence of a guard ring 10, the layout in top-plan view of the MPS device 30 is symmetric with respect to any line of symmetry passing through the centroid of the geometric figure delimited by the outer edges of the grid-like pattern (array) of Schottky cells 33 or, analogously, of the outer edges of the active area 14.

It is noted that the guard ring 10 in FIG. 4A has a quadrangular shape with rounded corners 10a. In order to avoid a current crowding effect at said corners while at the same time shrinking the overall dimensions of the device, in the embodiment of FIG. 4A Schottky cells are not present at said rounded corners 10a.

As shown in FIG. 4C, other embodiments, where Schottky cells 33 are present at said rounded corners 10a are possible (in this case, the guard ring 10 may be moved away from the active area 14, increasing the dimensions of the device 30 but avoiding the undesired current-crowding effect at the corners 10a).

FIG. 5 shows an embodiment of an MPS device 30' where Schottky cells 33', which correspond in terms of functions to the Schottky cells 33 of MPS device 30, have each a quadrangular shape with rounded corners. Other elements of the MPS device 30' in common with elements of the MPS device 30 are identified with the same reference numerals and not further described. The cross sectional view of MPS device 30', taken along the line IV-IV in FIG. 5, correspond to that of FIG. 4B and therefore is not shown.

FIG. 6 shows an embodiment of an MPS device 30" where Schottky cells 33", which correspond in terms of functions to the Schottky cells 33 of MPS device 30, have each a circular shape. Other elements of the MPS device 30" in common with elements of the MPS device 30 are identified with the same reference numerals and not further described.

The cross sectional view of MPS device 30", taken along the line IV-IV in FIG. 6, correspond to that of FIG. 4B and therefore is not shown.

According to the present disclosure, a method is also provided for manufacturing the MPS device 30 (reference can be made to FIGS. 7-11). The method disclosed herein can be also applied to manufacture the MPS device 30' and MPS device 30" of FIGS. 4 and 5.

FIGS. 7-11 illustrate, in lateral sectional view, steps of processing of a wafer 100 of semiconductor material. FIGS. 7-11 show the wafer 100 in the triaxial system of mutually orthogonal axes X, Y, Z of FIGS. 4A-4B.

Figure 7:
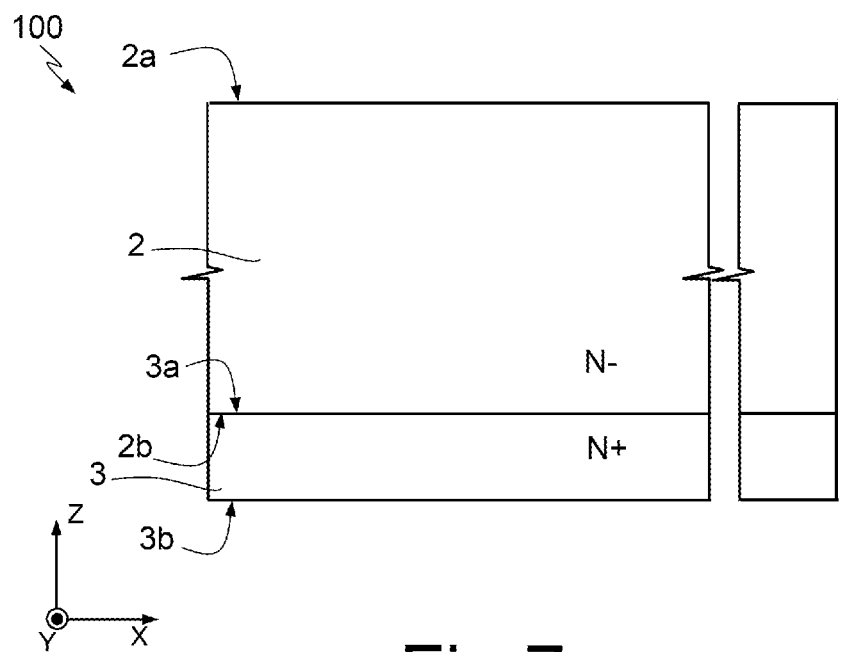
FIGS. 7-11 show, in cross-sectional view, steps for manufacturing the MPS device of FIGS. 4A, 4B.

With reference to FIG. 7, the wafer 100 comprises the substrate 3 of semiconductor material, in particular silicon carbide (SiC) having a first conductivity type (in this embodiment a doping of an N type), provided with a front side 3a and a back side 3b that are opposite to one another along the Z axis. The resistivity of the substrate 30 is, for example, comprised between 5 mΩ·cm and 40 mΩ·cm.

On the front side 3a of the substrate 3, it is formed, for example by epitaxial growth, the drift layer 2, of silicon carbide having the first conductivity type (N) and having a concentration of dopants lower than that of the substrate 3, for example comprised between $1 \cdot 10^{14}$ and $5 \cdot 10^{16}$ atoms/cm$^3$. The drift layer 2 is made of SiC, in particular 4H—SiC, but other polytypes may be used, such as 2H, 6H, 3C, and/or 15R.

Alternatively, the substrate 3 and the drift layer 2 may be made of other semiconductor materials, for example GaN, GaAs, Ge.

The drift layer 2 extends between a top side 2a and a bottom side 2b (the latter in direct contact with the front side 3a of the substrate 3).

Figure 8:
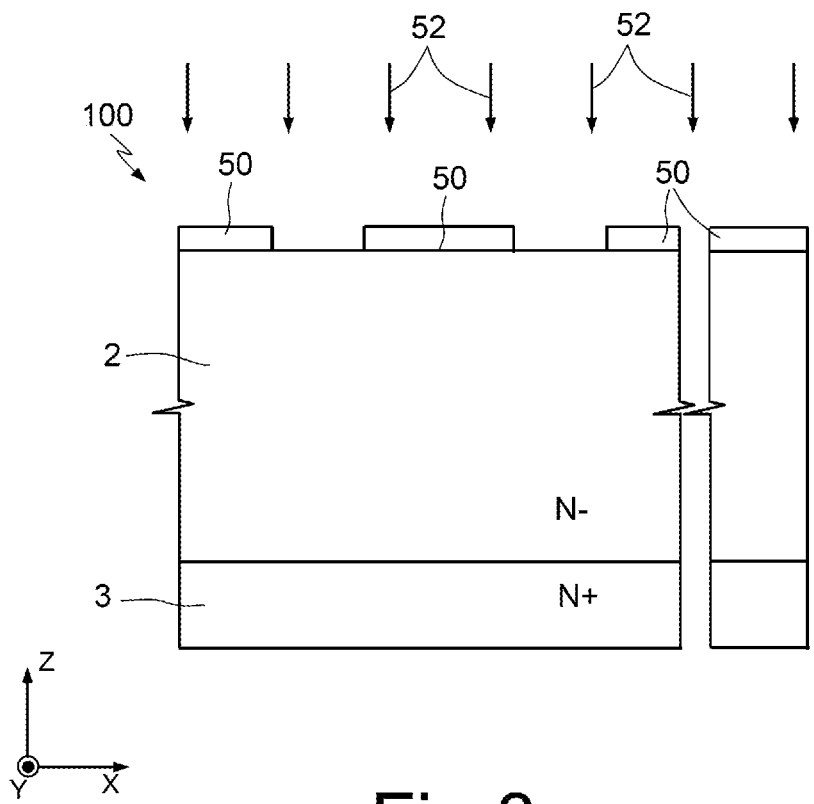

Then, FIG. 8, on the top side 2a of the drift layer 2 a hard mask 50 is formed, for example by deposition of photoresist, or TEOS, or other material. The hard mask 50 has a thickness of between 0.5 μm and 2 μm, or in any case a thickness such as to shield the implantation described hereinafter with reference to the same FIG. 8. The hard mask 34 thus formed extends in a region of the wafer 100 where, in subsequent steps, the active area 14 of the MPS device 30 will be formed.

In top-plan view, on the XY plane, the hard mask 50 covers the regions of the top side 2a of drift layer 2 which will form the Schottky cells 33 and leaves exposed regions of the top side 2a of drift layer 2 which will form the implanted regions 19', identified with reference to FIGS. 4A and 4B.

A step is now carried out of implantation of dopant species (e.g., boron or aluminum), which have the second conductivity type (here, P), exploiting the hard mask 50 (the implantation is indicated in the figure by arrows 52). The implanted regions 19' are thus formed.

During the above implantation step, the guard ring 10, if present, is also formed.

In one embodiment, the step of FIG. 8 comprises one or more implantations of dopant species, which have the second type of conductivity, with implantation energy comprised between 30 keV and 400 keV, and with doses of between $1 \cdot 10^{12}$ atoms/cm$^2$ and $1 \cdot 10^{15}$ atoms/cm$^2$, in order to form the implanted regions 19' with dopant concentration higher than $1 \cdot 10^{18}$ atoms/cm$^3$.

Figure 9:
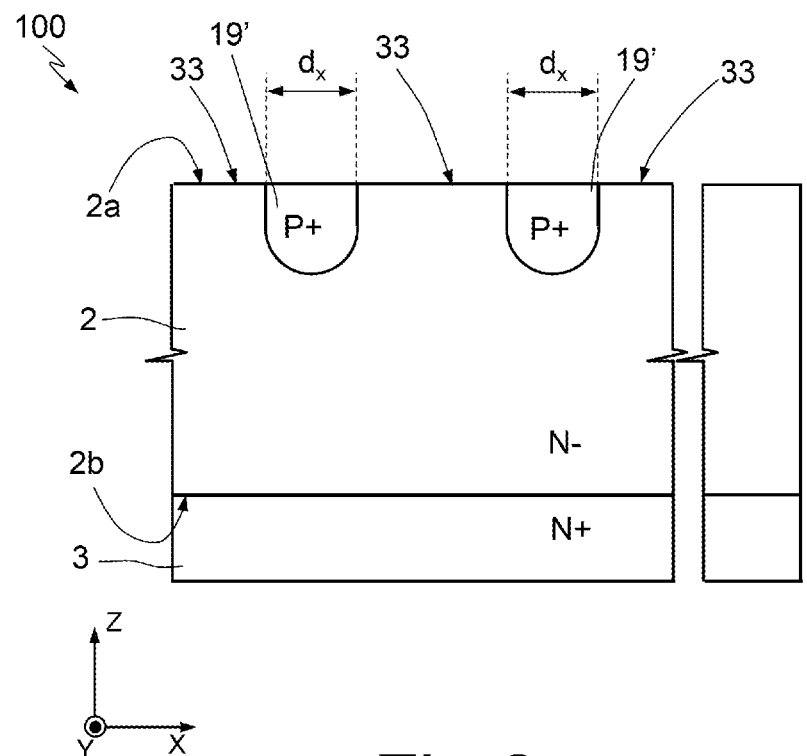
Figure 10:
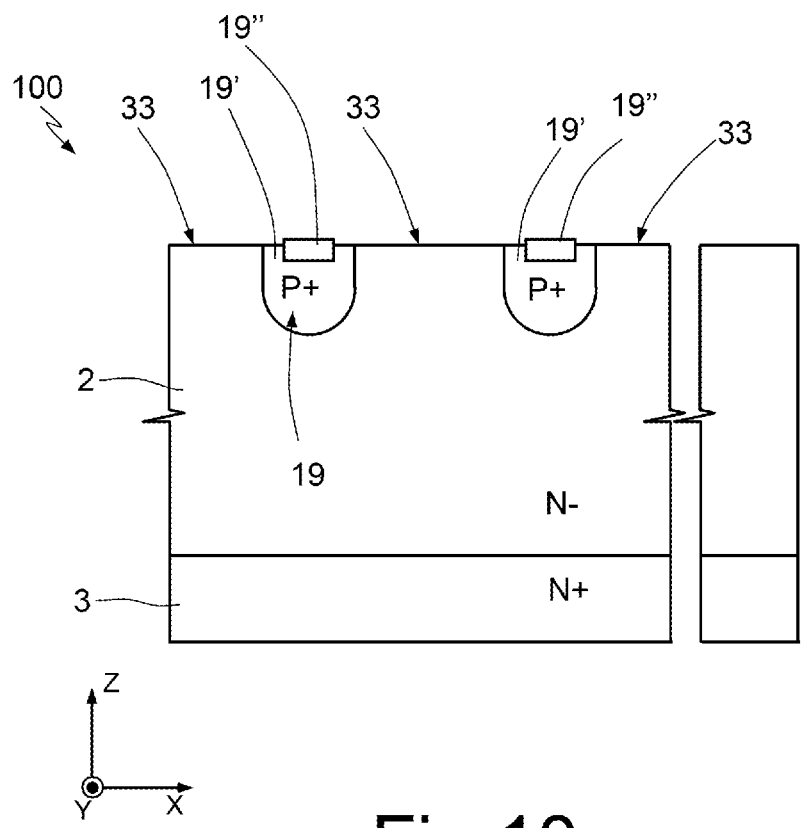

Next, FIG. 9, the mask 50 is removed and a step of thermal annealing is carried out for diffusion and activation of the dopant species implanted in the step of FIG. 8. The thermal annealing is, for example, carried out at a temperature higher than 1600° C. (e.g., between 1700 and 1900° C., and in some cases even higher). Following upon thermal annealing, the implanted regions 19' have a concentration of dopant species comprised between approximately $1 \cdot 10^{17}$ atoms/cm$^3$ and $1 \cdot 10^{20}$ atoms/cm$^3$. Implanted regions 19' are thus formed. At the same time, also Schottky cells 33 are formed, that are the portions of the drift layer 2 which extends laterally to the implanted regions 19' or, in other words, the portions of the drift layer 2 of N-type masked during the implantation step of FIG. 8.

The Ohmic contacts 19" (e.g., of nickel silicide—Ni$_2$Si) are then formed at each implanted region 19', thus concurring to the formation of the respective JB elements 19. It is noted that implanted regions 19' visible in the cross sectional view are actually one uniform region, as it can be appreciated from the top view of FIG. 4A. Accordingly, also ohmic contacts 19" are formed as one contact electrically connected to the implanted regions 19'. Therefore, the Schottky cells 33 are also separated from one another, along X and Y directions, by ohmic contacts 19" extending on the implanted regions 19'. As discussed above, the Ohmic contacts 19" form a continuous grid overlying the grid of implanted regions 19' and are therefore completely connected to one another.

An ohmic contact is also formed at the guard ring 10, electrically connected to the ohmic contacts 19".

The formation of ohmic contacts 19" includes forming a hard mask of thin oxide (e.g., in the range of 100 μm-500 μm); then photolithography and etching steps are performed to etch the regions where ohmic contacts 19" are to be formed; then, a deposition of metal material is carried out and a subsequent thermal treatment is performed (e.g., at a temperature in the range 900° C.-1100° C. for a time interval in the range 10 minutes-120 minutes). The metal thus deposited reacts with the superficial SiC material forming Ni2Si (i.e., the ohmic contact), while the metal in contact with the oxide does not react. Then a step of removal of the non-reacted metal is carried out and, then, a step of removal of the oxide metal is carried out.

Figure 11:
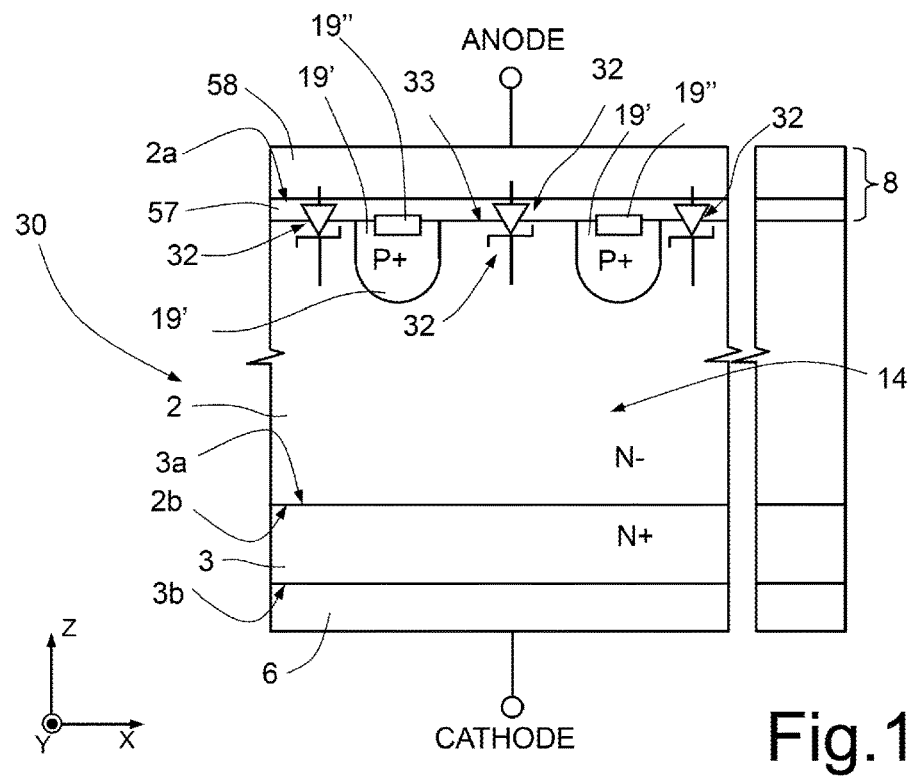

Then, FIG. 11, a step of forming an anode metallization is carried out.

To this end, an interface layer 57 of metal material, such as titanium, nickel, molybdenum, is deposited on the drift layer 2. The interface layer 57 is deposited via sputtering and has a thickness of between approximately 10 nm and 500 nm. The interface layer 57 extends in contact with the implanted regions 19' through the ohmic contacts 19", and with the exposed regions 33 of the drift layer 32 between the ohmic contacts 19" (i.e., the Schottky cells 33). In particular, the interface layer 57 contributes to the formation of a Schottky contact/Schottky barrier with the exposed regions 33 of the drift layer 32 and to the formation of junction-barrier (JB) elements with the implanted regions 19' through the ohmic contacts 19".

Next, a further metal layer 58 is formed on top of, and in direct contact with, the interface layer 57. The metal layer 58 is, for example, of aluminum or copper, and has a thickness of a few microns, for example between 1 and 10 μm.

The ensemble constituted by the interface layer 57 and the metal layer 58 forms the anode metallization reference as 8 in FIG. 4B.

A plurality of metal-semiconductor junctions of a Schottky type 32 are thus formed between the anode metallization 8 and the regions of the drift layer 2 that have the first conductivity type (N), as represented in FIG. 11.

In an alternative embodiment (not illustrated), the interface layer 57 is omitted, so that the anode metallization 8 coincides with the metal layer 58, which extends in direct contact with the drift layer 2.

Then, cathode contact 6 is formed on the back side 3b of the substrate 3, for example by depositing a layer of metal material adapted to form an ohmic contact with the substrate 3.

The region of the drift layer 2 that extends along the axis Z between the Schottky junctions and the cathode is the active area 14 of the diode 30 (i.e., the region where drift of the electrical charges occurs). The guard ring 10 (not shown in FIG. 11) surrounds the active area 14.

On the same wafer 100, a plurality of MPS devices 30 are formed. A final step of die singulation is carried out to physically isolate one MPS device 30 from another. The MPS devices 30 of FIGS. 4A, 4B is thus formed.

From an examination of the characteristics of the disclosure provided according to the present disclosure the advantages that it affords are evident.

Finally, it is clear that modifications and variations may be made to what has been described and illustrated herein, without thereby departing from the scope of the present disclosure.

Figure 12:
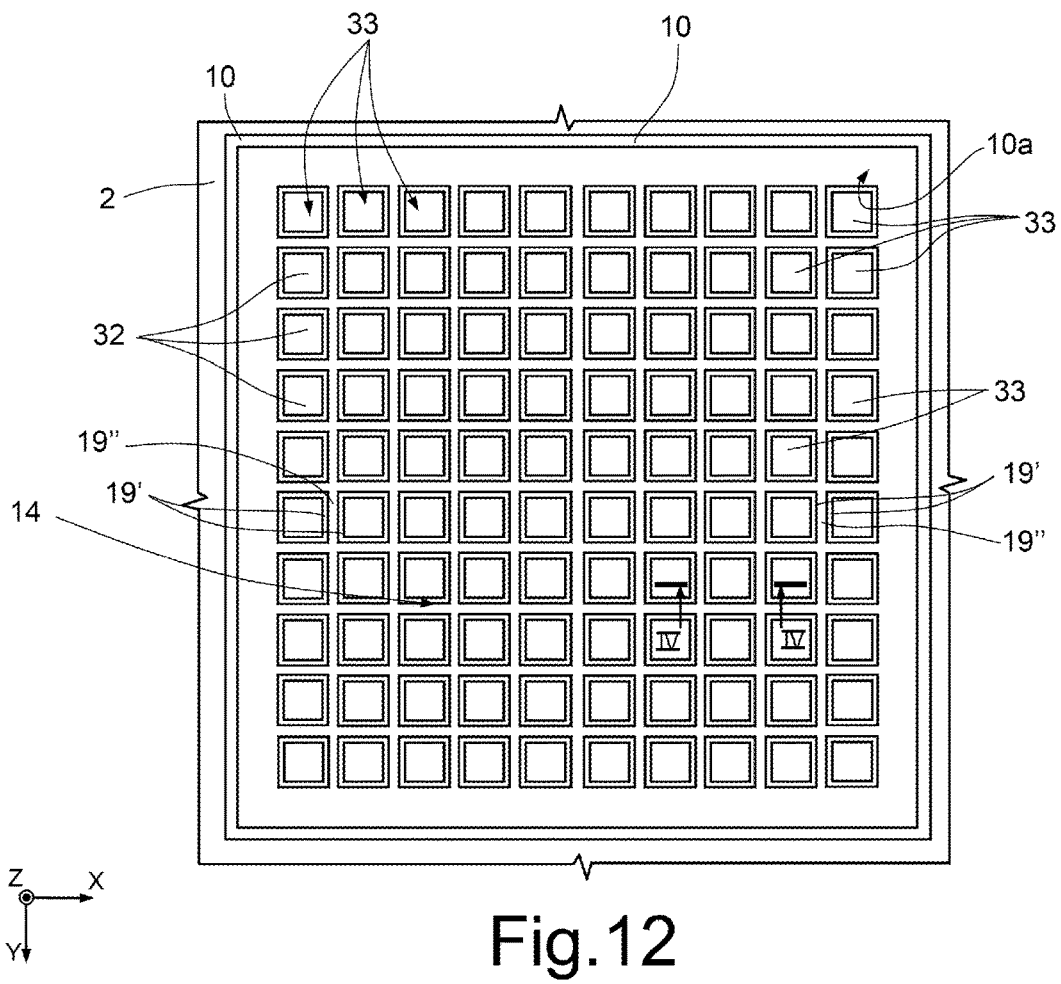
FIG. 12 shows, in top-plan view, a MPS (Merged-PN-Schottky) device according to a further embodiment of the present invention.

In particular, FIG. 12 shows a further embodiment of the present disclosure, where the guard ring 10 has a quadrangular shape and Schottky cells 33 are also present at the inner corners of the guard ring 10.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A merged-PN-Schottky (MPS) diode, comprising:
a semiconductor substrate having an N-type conductivity and a first doping level;
a drift layer of semiconductor material on the substrate, having a bottom surface which faces said substrate and a top surface opposite to the bottom surface, N-type conductivity, and a second doping level lower than the first doping level;
a doped region of P-type conductivity, extending in the drift layer at the top surface;
an ohmic contact in direct electrical contact with the doped region at the top surface,
a plurality of cells of N-type conductivity and said second doping level, extending in the drift layer within and through the doped region and facing the top surface, the doped region including a continuous grid delimiting the plurality of cells with respect to upper portions of the drift layer, the plurality of cells being a quadrangular array of cells having rows of cells and columns of cells, and the grid separating the rows of cells from each other and separating the columns of cells from each other; and
an anode metallization on said top surface, in contact with the ohmic contact and with said cells such as to form a junction-barrier (JB) diode with said doped region and Schottky diodes with said cells, the JB diode and the Schottky diodes defining an active area of the MPS diode, wherein:
the doped region has, in top-plan view, a grid-shaped layout delimiting said plurality of cells;
each cell has a same geometry; and
said ohmic contact extends at said doped region with continuity along the grid-shaped layout.

2. The MPS diode according to claim 1, wherein said grid-shaped layout is symmetric with respect to an axis of symmetry passing through a centroid of a geometrical shape defined by outer edges of the active area.

3. The MPS diode according to claim 1, wherein the doped region is formed by a plurality of first elongated regions, each having a respective main direction of extension parallel to a first axis, and by a plurality of second elongated regions, each having a respective main direction of extension parallel to a second axis orthogonal to the first axis, said first and second elongated regions being designed to separate, in a top-plan view, each cell from one another and to shape said cells in such a way that each has, in the top-plan view, said shape among quadrangular, quadrangular with rounded corners and circular.

4. The MPS diode according to claim 1, wherein each cell is a portion of the drift layer free from said doped region.

5. The MPS diode according to claim 1, wherein said substrate and said drift layer are both of silicon carbide or gallium nitride.

6. The MPS diode according to claim 1, wherein each one of said cells has an area, at said top surface, in a range 1 $\mu m^2$-100 $\mu m^2$.

7. The MPS diode according to claim 1, further comprising an edge-termination region, completely surrounding said active area and extending as a prolongation of said doped region.

8. A merged-PN-Schottky (MPS) diode, comprising:
a semiconductor substrate having a first conductivity type and a first doping level;
a semiconductor drift layer of the first conductivity type on the substrate, the drift layer having a top surface and a second doping level lower than the first doping level;
a doped region of a second conductivity type, extending downward in the drift layer from the top surface, the doped region forming a continuous first grid delimiting a plurality of cells with respect to upper portions of the drift layer, the cells forming a quadrangular array of cells having rows of cells and columns of cells, the first grid separating the rows of cells from each other and separating the columns of cells from each other;
an ohmic contact in direct electrical contact with the doped region at the top surface, the ohmic contact forming a continuous second grid overlying the first grid and extending continuously between the rows of cells and the columns of cells; and
an anode metallization on said top surface, in contact with the ohmic contact and with said cells such as to form a junction-barrier (JB) diode with said doped region and Schottky diodes with said cells.

9. The MPS diode according to claim 8, further comprising a guard ring of second conductivity type formed in the drift region and completely laterally surrounding the plurality of cells and defining an active area, wherein said grid-shaped layout is symmetric with respect to an axis of symmetry passing through a centroid of a geometrical shape defined by the guard ring.

10. The MPS diode according to claim 9, wherein the guard ring extends as a prolongation of said doped region.

11. The MPS diode according to claim 8, wherein each cell has, in top-plan view, a quadrangular shape.

12. The MPS diode according to claim 8, wherein said substrate and said drift layer are both of silicon carbide or gallium nitride.

13. The MPS diode according to claim 8, wherein each one of said cells has an area, at said top surface, in a range 1 µm$^2$-100 µm$^2$.

14. A semiconductor device, comprising:
- a semiconductor substrate doped with a first conductivity type;
- a drift layer on the semiconductor substrate doped with the first conductivity type and having a top surface;
- a doped region of a second conductivity type embedded in the drift region, having a top surface that is substantially coplanar with the top surface of the drift region, and defining a first grid in the drift region;
- an ohmic contact on the doped region and defining a second grid overlaying the first grid, wherein the first grid and the second grid define a plurality of cells, wherein the first grid delimits the plurality of cells with respect to upper portions of the drift layer, the plurality of cells being a quadrangular array of cells having rows of cells and columns of cells, and the first grid separating the rows of cells from each other and separating the columns of cells from each other; and
- an anode metalization in contact with the top surface of the drift region, the ohmic contact, and portions of the top surface of the doped region outside of the ohmic contact, wherein each cell includes a Schottky diode.

15. The semiconductor device of claim 14, wherein the anode metalization includes nickel.

16. The semiconductor device of claim 14, further comprising an edge-termination region of the second conductivity type completely surrounding the second grid and extending as a prolongation of said doped region.

17. The semiconductor device of claim 14, wherein each cell includes a portion of the drift layer a portion of the doped region.

18. The semiconductor device of claim 14, wherein said substrate and said drift layer are both of silicon carbide or gallium nitride.

* * * * *